(12) United States Patent
Roh

(10) Patent No.: US 11,217,545 B2
(45) Date of Patent: Jan. 4, 2022

(54) SEMICONDUCTOR PACKAGE

(71) Applicant: Samsung Electronics Co., Ltd., Suwon-si (KR)

(72) Inventor: Junghyun Roh, Asan-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 16/780,084

(22) Filed: Feb. 3, 2020

(65) Prior Publication Data

US 2020/0402936 A1 Dec. 24, 2020

(30) Foreign Application Priority Data

Jun. 20, 2019 (KR) .................. 10-2019-0073752

(51) Int. Cl.
*H01L 25/065* (2006.01)
*H01L 23/00* (2006.01)

(52) U.S. Cl.
CPC .............. *H01L 24/06* (2013.01); *H01L 24/03* (2013.01); *H01L 24/05* (2013.01); *H01L 24/09* (2013.01); *H01L 24/13* (2013.01); *H01L 24/16* (2013.01); *H01L 24/73* (2013.01); *H01L 24/92* (2013.01); *H01L 25/0657* (2013.01); *H01L 2224/0401* (2013.01); *H01L 2224/0557* (2013.01); *H01L 2224/05552* (2013.01); *H01L 2224/05556* (2013.01); *H01L 2224/0616* (2013.01); *H01L 2224/0916* (2013.01); *H01L 2224/13026* (2013.01); *H01L 2224/16104* (2013.01); *H01L 2224/16227* (2013.01); *H01L 2224/73204* (2013.01); *H01L 2224/9211* (2013.01);

(Continued)

(58) Field of Classification Search
CPC ..................................................... H01L 24/03
See application file for complete search history.

(56) References Cited

U.S. PATENT DOCUMENTS 5,767,580 A 6/1998 Rostoker
5,872,399 A 2/1999 Lee
(Continued)

FOREIGN PATENT DOCUMENTS

JP H11307683 A 11/1999
JP 2001156206 A 6/2001
JP 2010267792 A 11/2010

*Primary Examiner* — William A Harriston
(74) *Attorney, Agent, or Firm* — Harness, Dickey & Pierce, P.L.C.

(57) ABSTRACT

A semiconductor package includes a first substrate having a first surface and including a first electrode, a first bump pad located on the first surface of the first substrate and connected to the first electrode, a second substrate having a second surface facing the first surface of the first substrate and including a second electrode, a second bump pad and neighboring second bump pads on the second surface of the second substrate, and a bump structure. The second bump pad has a recess structure. That is recessed from a side surface of the second bump pad toward a center thereof. The second bump pad may be connected to the second electrode. A bump structure may contact the first bump pad and the second bump pad. The bump structure may have a portion protruding through the recess structure. The neighboring second bump pads may neighbor the second bump pad and include recess structures oriented in different directions.

20 Claims, 19 Drawing Sheets

(52) U.S. Cl.
CPC ............ *H01L 2225/06513* (2013.01); *H01L 2225/06541* (2013.01); *H01L 2225/06565* (2013.01)

(56) References Cited

U.S. PATENT DOCUMENTS

| | | |
|---|---|---|
| 8,218,333 B2 | 7/2012 | Udaka et al. |
| 9,313,881 B2 | 4/2016 | Healy et al. |
| 9,368,461 B2 | 6/2016 | Albers et al. |
| 2008/0156521 A1* | 7/2008 | Karasawa .............. H05K 1/111 |
| | | 174/260 |

* cited by examiner

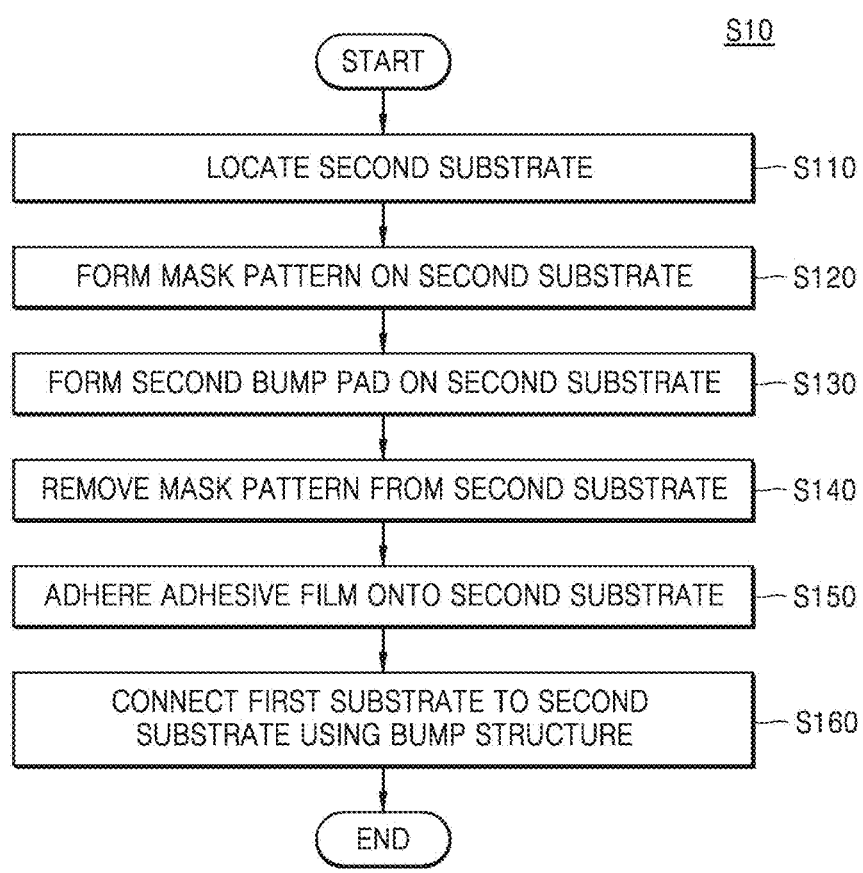

SEMICONDUCTOR PACKAGE

CROSS-REFERENCE TO RELATED APPLICATION

This application claims the benefit of Korean Patent Application No. 10-2019-0073752, filed on Jun. 20, 2019, in the Korean Intellectual Property Office, the disclosure of which is incorporated herein in its entirety by reference.

BACKGROUND

Inventive concepts relate to a semiconductor package, and more particularly, to a semiconductor package including a bump structure.

With the rapid development of the electronics industry and the growing needs of users, electronic devices are becoming more compact and multifunctional. Thus, the necessity of miniaturization and multifunctionality of the semiconductor devices (e.g., semiconductor chips) used in electronic devices is also increasing. Semiconductor devices having connection terminals with fine pitches are required, and connection terminals (e.g., bump structures) with fine sizes are needed to mount high-capacity semiconductor devices in limited structures of semiconductor packages. In addition, distances between bump structures included in the semiconductor packages are being continuously reduced.

SUMMARY

Some inventive concepts provide examples of a semiconductor package in which a bump pad having a recess structure is located under a bump structure, to improve electrical characteristics and reliability.

Aspects of inventive concepts should not be limited by the above description, and other unmentioned aspects will be clearly understood by one of ordinary skill in the art from example embodiments described herein.

According to an aspect of inventive concepts, a semiconductor package includes a first substrate having a first surface and including a first electrode; a first bump pad on the first surface of the first substrate; a second substrate having a second surface facing the first surface of the first substrate; a second bump pad and neighboring second bump pads on the second surface of the second substrate; and a bump structure. The first bump pad is connected to the first electrode. The second substrate includes a second electrode. The second bump pad has a recess structure that is recessed from a side surface of the second bump pad toward a center thereof. The second bump pad is connected to the second electrode. The neighboring second bump pads neighbor the second bump pad and include recess structures. The structures of the neighboring second bump pads are oriented in different directions. The bump structure contacts the first bump pad and the second bump pad. The bump structure has a portion protruding through the recess structure of the second bump pad.

According to another aspect of the inventive concept, a semiconductor package includes a first substrate having a first surface; a first bump pad on the first surface of the first substrate; a second substrate having a second surface located opposite the first surface of the first substrate; a second bump pad and a neighboring second bump pad on the second surface of the second substrate; and a bump structure. The second bump pad has two recess structures that are each recessed from a side surface of the second bump pad toward a center thereof. The neighboring second bump pad neighbors the second bump pad and includes two recess structures. A first virtual line extending along the two recess structures of the second bump pad is perpendicular to a second virtual line extending along the two recess structures of the neighboring second bump pad. The bump structure contacts the first bump pad and the second bump pad.

According to another aspect of the inventive concept, a semiconductor package includes a first substrate having a first surface and including a first through electrode; a first bump pad on the first surface of the first substrate; a second substrate having a second surface located opposite to the first surface of the first substrate; a second bump pad and neighboring second bump pads on the second surface of the second substrate; and a bump structure contacting the first bump pad and the second bump pad. The first bump pad is connected to the first through electrode. The second substrate includes a second through electrode and other second through electrodes. The second bump pad has a recess structure that is recessed from a side surface of the second bump pad toward a center thereof. The second bump pad is connected to the second through electrode. The neighboring second bump pads neighbor the second bump pad and include recess structures. The recess structures of the neighboring second bump pads are oriented in different directions. A corresponding one of the neighboring second bump pads is connected to at least two of the other second through electrodes.

BRIEF DESCRIPTION OF THE DRAWINGS

Embodiments of inventive concepts will be more clearly understood from the following detailed description taken in conjunction with the accompanying drawings in which:

FIG. 6 is a flowchart of a method of manufacturing a semiconductor package, according to an embodiment;

DETAILED DESCRIPTION OF THE EMBODIMENTS

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Hereinafter, embodiments will be described in detail with reference to the accompanying drawings.

Figure 1A:
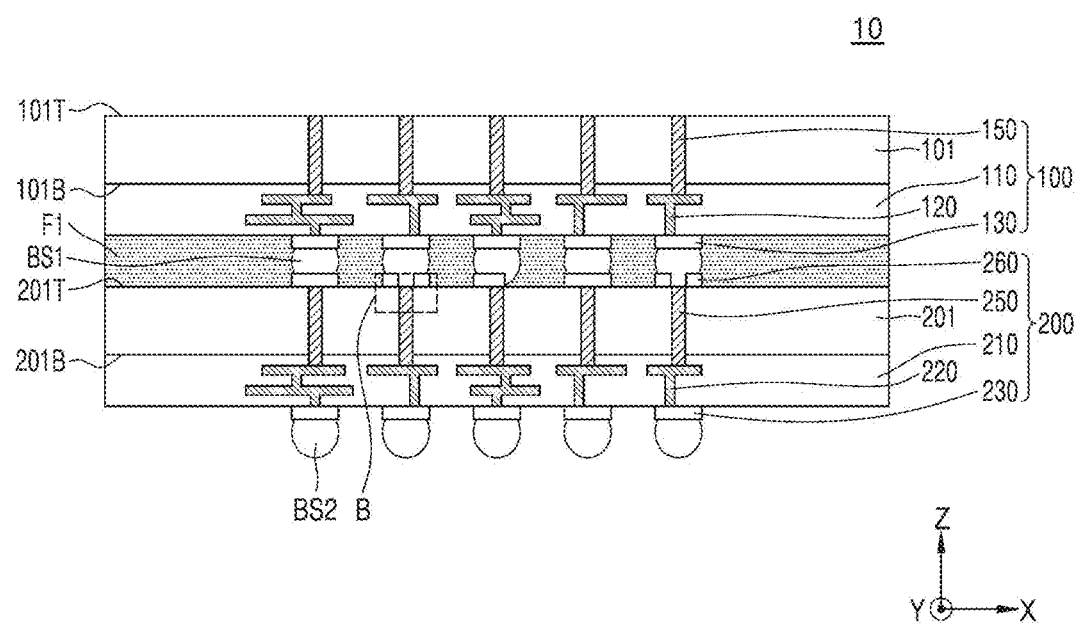
FIGS. 1A to 1C are diagrams of a semiconductor package according to an embodiment.
Figure 1B:
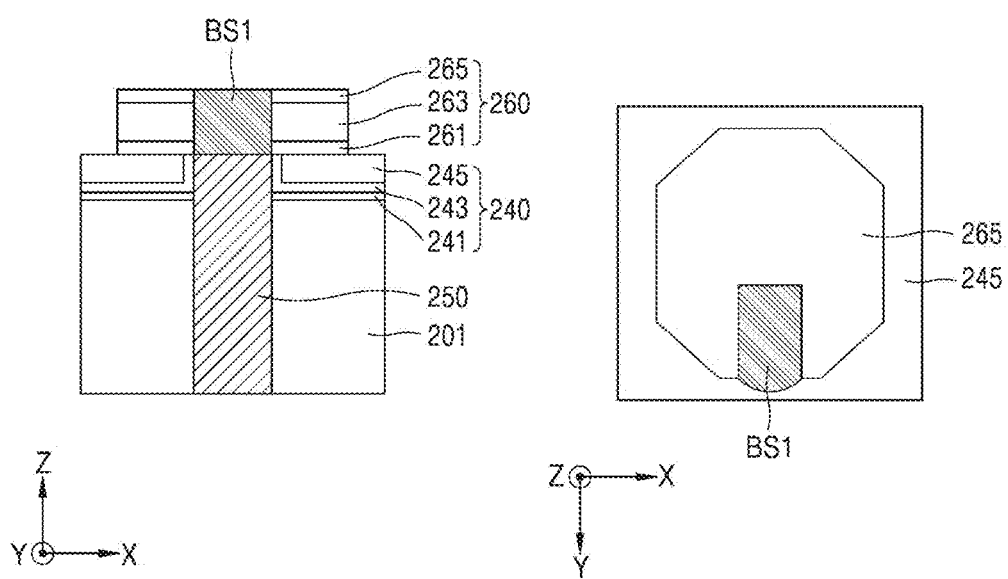
Figure 1C:
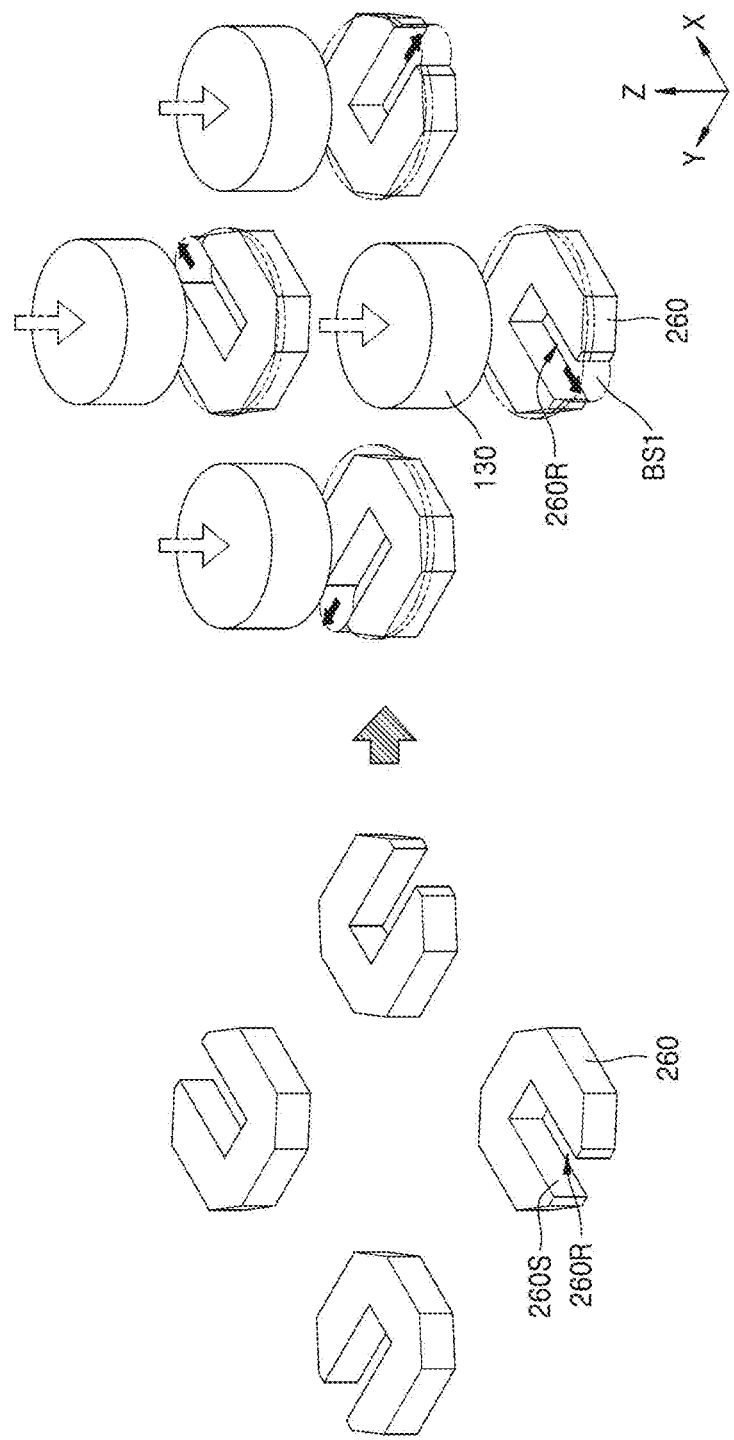

FIGS. 1A to 1C are diagrams of a semiconductor package 10 according to an embodiment.

Specifically, FIG. 1A is a cross-sectional view of the semiconductor package 10, FIG. 1B shows an enlarged cross-sectional view (left) and an enlarged plan view (right) of region B of FIG. 1A, and FIG. 1C is a perspective view showing characteristics of second bump pads 260 of the semiconductor package 10. Bump structures BS1 are illustrated as transparent in FIG. 1C.

Referring to FIGS. 1A to 1C, the semiconductor package 10 may include a first substrate 101 having first bump pads 130, a second substrate 201 having the second bump pads 260, and bump structures BS1, which are in contact with the first bump pads 130 and the second bump pads 260, respectively.

Each of first and second semiconductor devices 100 and 200 included in the semiconductor package 10 may include a logic chip or a memory chip. For example, the first and second semiconductor devices 100 and 200 may include memory chips of the same type. Alternatively, one of the first and second semiconductor devices 100 and 200 may include a memory chip, and the other one thereof may include a logic chip.

The memory chip may include, for example, a volatile memory chip, such as a dynamic random access memory (DRAM) chip or a static RAM (SRAM) chip, or a non-volatile memory chip, such as a phase-change RAM (PRAM) chip, a magneto-resistive RAM (MRAM) chip, a ferroelectric RAM (FeRAM) chip, or a resistive RAM (RRAM) chip. In addition, the logic chip may include, for example, a microprocessor (MP), an analog device, or a digital signal processor (DSP).

The first semiconductor device 100 may include the first substrate 101, a first semiconductor device layer 110, first interconnection layers 120, the first bump pads 130, and first through electrodes 150.

The first substrate 101, which may be a semiconductor substrate, may include a top surface 101T and a bottom surface 101B, which are opposite to each other. The bottom surface 101B may be referred to as a first surface. The first substrate 101 may include the first semiconductor device layer 110, which is formed on the first surface 101B, and the first through electrodes 150, which are formed through the first substrate 101.

The first substrate 101 may include a silicon wafer including silicon (Si), for example, crystalline silicon, polycrystalline silicon, or amorphous silicon. Alternatively, the first substrate 101 may include a semiconductor element (e.g., germanium (Ge)) or a compound semiconductor (e.g., silicon carbide (SiC), gallium arsenide (GaAs), indium arsenide (InAs), and indium phosphide (InP)). In addition, the first substrate 101 may have a silicon-on-insulator (SOI) structure. For example, the first substrate 101 may include a buried oxide (BOX) layer. The first substrate 101 may include a conductive region, for example, a doped well or a doped structure. Also, the first substrate 101 may have various device isolation structures, such as a shallow trench isolation (STI) structure.

The first semiconductor device layer 110 may include the first interconnection layers 120 configured to connect a plurality of semiconductor devices to other interconnections formed on the first substrate 101. Each of the first interconnection layers 120 may include a metal interconnection layer and a via plug. For example, each of the first interconnection layers 120 may have a multi-layered structure in which at least two metal interconnection layers and at least two via plugs are alternately stacked.

The first bump pads 130 may be located on the first semiconductor device layer 110 and electrically connected to the first interconnection layers 120 in the first semiconductor device layer 110. The first bump pads 130 may be electrically connected to the first through electrodes 150 through the first interconnection layers 120. The first bump pads 130 may also be considered to be on the first semiconductor device layer 110, despite the presence of intervening structures like the first interconnection layer 120. The first bump pads 130 may include a conductive metal, for example at least one of aluminum (Al), copper (Cu), nickel (Ni), tungsten (W), platinum (Pt), and gold (Au), but are not limited thereto.

Although not shown, a lower passivation layer may be formed on the first semiconductor device layer 110 to protect the first interconnection layers 120 formed in the first semiconductor device layer 110 and other structures located thereunder from external impacts or moisture. The lower passivation layer may expose top surfaces of the first bump pads 130.

The first through electrodes 150 may pass through the first substrate 101 and extend from the top surface 101T of the first substrate 101 to the first surface 101B thereof. The first through electrodes 150 may be connected to the first interconnection layers 120 in the first semiconductor device layer 110. The first bump pads 130 may be formed on the first semiconductor device layer 110 and electrically connected to the first through electrodes 150 through the first interconnection layers 120. At least a portion of each of the first through electrodes 150 may have a pillar shape. Each of the first through electrodes 150 may include a through-silicon via (TSV).

Although not shown, first upper pads may be formed on the top surface 101T of the first substrate 101 and electrically connected to the first through electrodes 150. The first upper pads may include substantially the same material as the first bump pads 130. In some embodiments, the first upper pads of the first substrate 101 may be substantially the same as the second bump pads 260 of the second substrate 201, which will be described below.

Although not shown, an upper passivation layer may be formed on the top surface 101T of the first substrate 101 and surround a portion of a side surface of each of the first through electrodes 150. In some embodiments, the upper passivation layer of the first substrate 101 may be substantially the same as an upper passivation layer 240 of the second substrate 201, which will be described below.

The bump structures BS1 may be in contact with the first bump pads 130. Via the bump structures BS1, the first semiconductor device 100 may receive at least one of a control signal for an operation of the first semiconductor device 100, a power signal, and a ground signal from the outside, receive a data signal to be stored in the first semiconductor device 100, or provide data stored in the first semiconductor device 100 to the outside. For example, each of the bump structures B Si may have a pillar structure, a ball structure, or a solder layer. For example, each of the bump structures BS1 may have a pillar structure, a ball structure, or a solder layer.

The second semiconductor device 200 may be located such that a top surface 201T of the second semiconductor device 200 faces the first surface 101B of the first semiconductor device 100. The top surface 201T may be referred to as a second surface. The second semiconductor device 200 may be electrically connected to the first semiconductor device 100 through the bump structures BS1 between the first semiconductor device 100 and the second semiconductor device 200.

In addition, an adhesive film F1 may be between the first surface 101B of the first semiconductor device 100 and the second surface 201T of the second semiconductor device 200 and adhere the second semiconductor device 200 to the first semiconductor device 100. As shown in FIG. 1A, the adhesive film F1 may be in direct contact with the first semiconductor device 100 and the second semiconductor device 200 and surround the bump structures BS1. The adhesive film F1 may include a die-attach film (DAF). The DAF may be an inorganic adhesive and a polymer adhesive. The polymer adhesive may include one or more thermosetting resins and/or thermoplastic resins or may be a hybrid type obtained by mixing a thermosetting resin with a thermoplastic resin.

The second semiconductor device 200 may include the second substrate 201, a second semiconductor device layer 210, second interconnection layers 220, second lower pads 230, second through electrodes 250, and the second bump pads 260. Because the second semiconductor device 200 has characteristics that are substantially the same as those of the first semiconductor device 100, differences between the first semiconductor device 100 and the second semiconductor device 200 will mainly be described.

The second semiconductor device layer 210 may be a bottom surface 201B of the second semiconductor device 200. The second lower pads 230 may be located on the second semiconductor device layer 210 and electrically connected to the second interconnection layers 220 in the second semiconductor device layer 210. The second lower pads 230 may be electrically connected to the second through electrodes 250 through the second interconnection layers 220. The second lower pads 230 may include substantially the same material as the first bump pads 130.

Second bump structures BS2 may be in contact with the second lower pads 230. The second bump structures BS2 may electrically connect the semiconductor package 10 to an external base substrate (not shown). Via the second bump structures BS2, the second semiconductor device 200 may receive at least one of a control signal for an operation of the second semiconductor device 200, a power signal, a ground signal from outside the semiconductor device 200, receive a data signal to be stored in the second semiconductor device 200, or provide data stored in the second semiconductor device 200 to outside the semiconductor device 200. For example, each of the second bump structures BS2 may have a pillar structure, a ball structure, or a solder layer.

The second bump pads 260 may be located on the second surface 201T of the second substrate 201 and electrically connected to the second through electrodes 250. The second bump pads 260 may include substantially the same material as the first bump pads 130.

Each of the second bump pads 260 may include a first conductive layer 261, a second conductive layer 263, and a third conductive layer 265. One of the first to third conductive layers 261, 263, and 265 may have a different thickness from the remaining ones thereof. Also, the first to third conductive layers 261, 263, and 265 may include respectively different materials, or only the second conductive layer 263 may include a different material from the first and third conductive layers 261 and 265.

Furthermore, each of the second bump pads 260 may have a recess structure 260R, which is recessed from a side surface of the second bump pad 260 toward a center thereof. In some embodiments, recess structures 260R of neighboring second bump pads 260 may be located and/or oriented in different directions. Also, due to the recess structure 260R, a portion of a top surface of the second through electrode 250 may be exposed by the second bump pads 260.

For example, the recess structures 260R of the neighboring second bump pads 260 may be located and/or oriented at a rotational angle of 90°, 180°, or 270° with each other. In some embodiments, each of the recess structures 260R may include three sidewalls 260S, which abut at right angles. In a view from above, the first bump pads 130 may have a circular shape, and the second bump pads 260 may have a polygonal shape.

As described above, the bump structures BS1 may be in contact with the first bump pads 130 and the second bump pads 260, and each have a portion that protrudes through the recess structure 260R. The bump structures BS1 may fill the recess structures 260R of the second bump pads 260, respectively. Accordingly, the portion of the top surface of the second through electrode 250, which is exposed by the second bump pads 260, may be in direct contact with and electrically connected to the bump structures BS1.

The upper passivation layer 240 may be formed on the second surface 201T of the second substrate 201 and surround a portion of a side surface of the second through electrode 250. The upper passivation layer 240 may include a first insulating layer 241, a second insulating layer 243, and a third insulating layer 245. At least one of the first to third insulating layers 241, 243, and 245 may include an etch stop film. One of the first to third insulating layers 241, 243, and 245 may have a different thickness from the remaining ones thereof. Also, the first to third conductive layers 241, 243, and 245 may include respectively different materials, or only the second conductive layer 243 may include a different material from the first and third conductive layers 241 and 245.

Here, by using the upper passivation layer 240 as an etch stop layer, a top surface of the upper passivation layer 240 may be at substantially the same level as the top surface of the second through electrode 250.

In recent years, semiconductor packages used in electronic devices have been required to have high performance and large capacity with miniaturization and weight reduction. In order to realize high performance and large capacity with miniaturization and weight reduction, research and development of semiconductor chips including through electrodes and semiconductor packages in which the semiconductor chips are stacked have been continuously conducted.

Since thicknesses of the semiconductor chips are structurally reduced to realize the miniaturization and weight reduction of the semiconductor packages in which the semiconductor chips are stacked, a distance between bump structures included in the semiconductor packages is also being continuously reduced to enable uniform adhesion of semiconductor chips and bonding of bump structures with fine sizes and obtain solder wettability, electrical reliability, and structural reliability in a process of stacking the semiconductor chips.

In a manufacturing process of a typical semiconductor package, during a process of bonding upper and lower semiconductor chips, which face each other, under pressure to each other with bump structures therebetween, when the number of bump structures protruding to the peripheries of bump pads is excessive, protrusions of neighboring bump structures may be bonded to each other to cause a short. As a result, quality degradation of the semiconductor packages may be caused.

To minimize or prevent the degradation of quality in the semiconductor packages 10, the second bump pads 260 having the recess structures 260R may be under the bump structures BS1. Thus, even under compression conditions, such as excessive pressing and/or misalignment between the first and second substrates 101 and 201, a direction in which the bump structure BS1 protrudes may be guided by the recess structure 260R in a desired (and/or alternatively predetermined) direction. In the above-described manner, a phenomenon where the protrusions of the neighboring bump structures BS1 are bonded to each other may be limited and/or prevented in advance, and thus, failures, such as a short, may be limited and/or prevented. As a result, the electrical characteristics and reliability of the semiconductor package 10 may be improved.

Figure 2A:
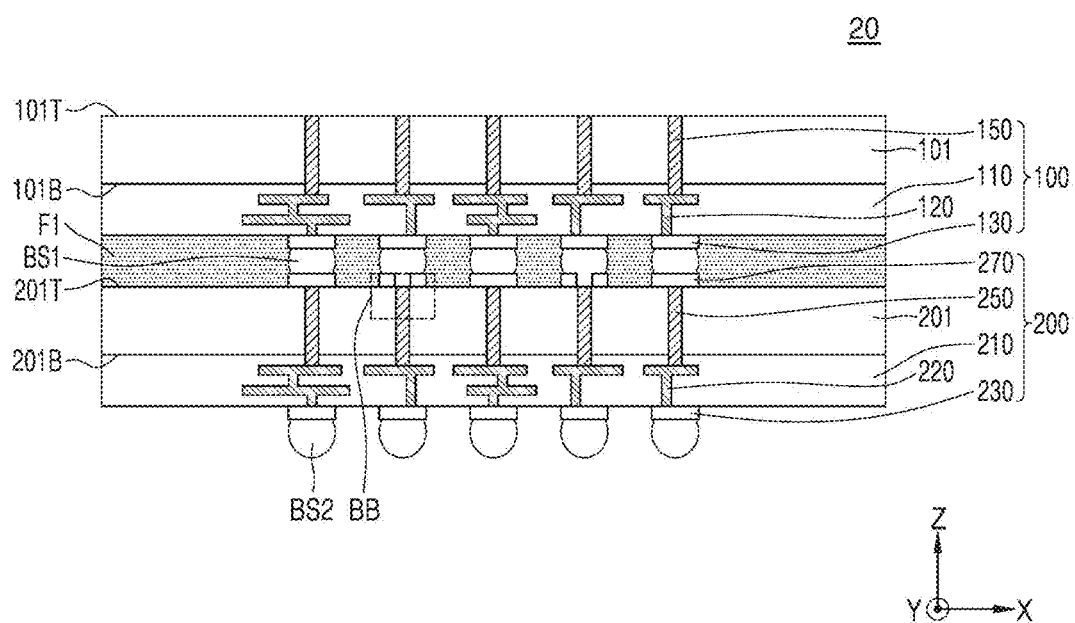
FIGS. 2A to 2C are diagrams of a semiconductor package according to an embodiment.
Figure 2B:
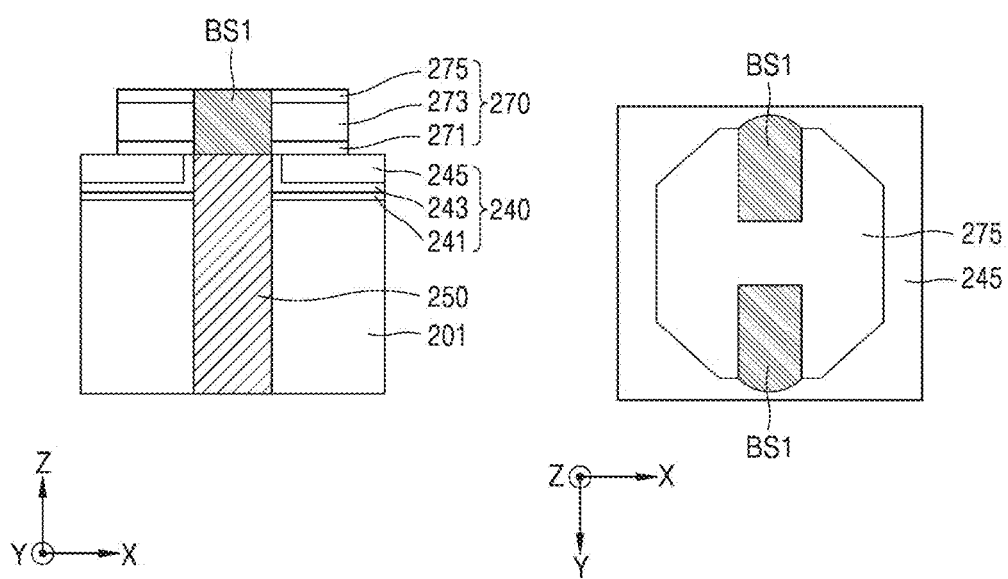
Figure 2C:
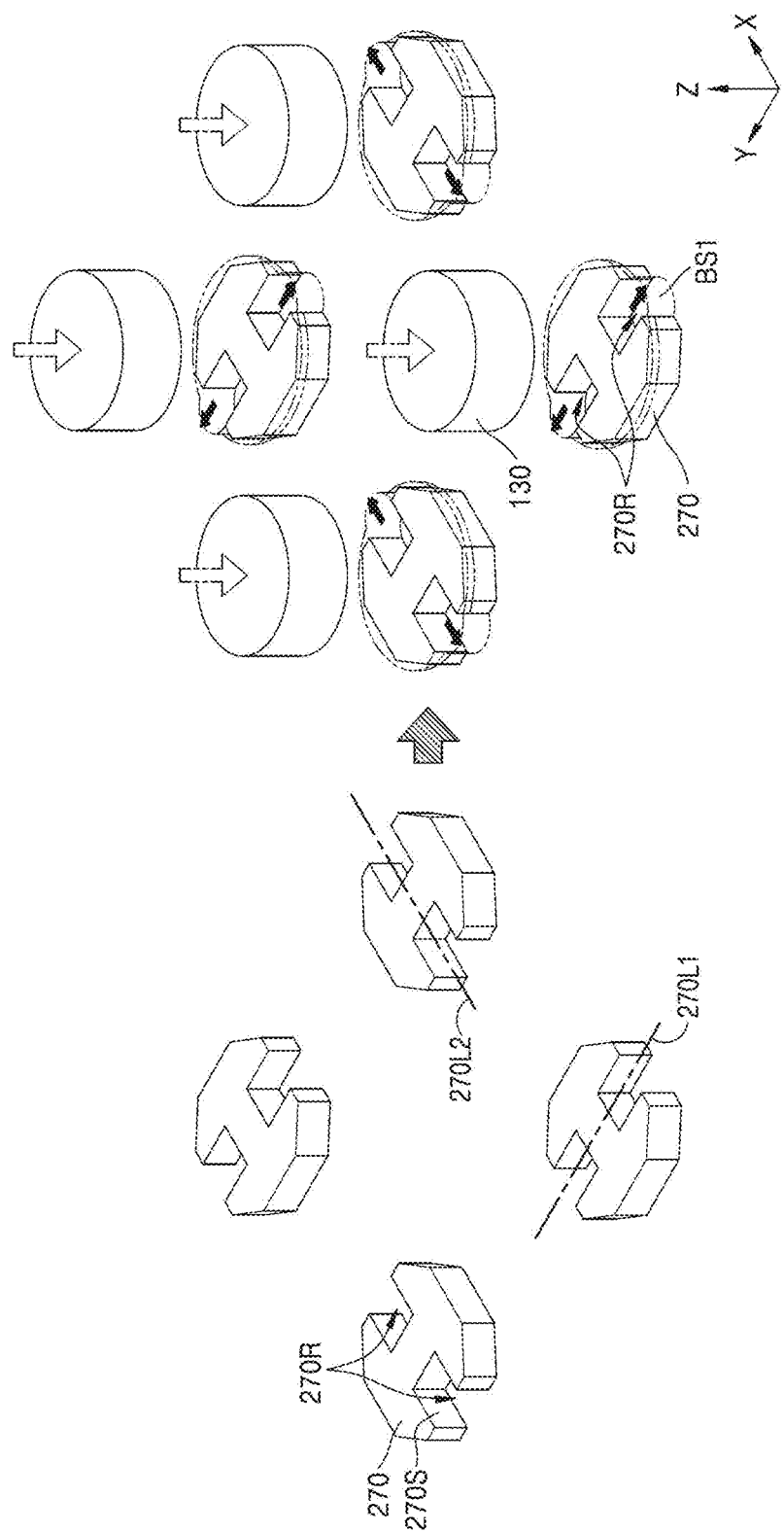

FIGS. 2A to 2C are diagrams of a semiconductor package 20 according to an embodiment.

Most components of the semiconductor package 20 to be described below and materials of the components may be substantially the same as or similar to those described above with reference to FIGS. 1A to 1C. Accordingly, for brevity, differences between the semiconductor package 20 and the above-described semiconductor package (refer to 10 in FIG. 1A) will mainly be described.

Specifically, FIG. 2A is a cross-sectional view of the semiconductor package 20, FIG. 2B shows an enlarged cross-sectional view (left) and an enlarged plan view (right) of region BB of FIG. 2A, and FIG. 2C is a perspective view showing characteristics of second bump pads 270 of the semiconductor package 20. For clarity, bump structures BS1 are illustrated transparently in FIG. 2C.

Referring to FIGS. 2A to 2C, the semiconductor package 20 may include a first substrate 101 having first bump pads 130, a second substrate 201 having second bump pads 270, and bump structures BS1, which are in contact with the first bump pads 130 and the second bump pads 270.

Each of the second bump pads 270 may include a first conductive layer 271, a second conductive layer 273, and a third conductive layer 275. One of the first to third conductive layers 271, 273, and 275 may have a different thickness from the remaining ones thereof. In addition, the first to third conductive layers 271, 273, and 275 may include respectively different materials, or only the second conductive layer 273 may include a different material from the first and third conductive layers 271 and 275.

Furthermore, each of the second bump pads 270 may have two recess structures 270R, which are recessed from a side surface of the second bump pad 270 toward a center thereof. In some embodiments, two recess structures 270R of one of neighboring second bump pads 270 may be located and/or oriented in different directions from two recess structures 270R of the other second bump pad 270. In addition, due to the two recess structures 270R, portions of a top surface of each of the second through electrodes 250 may be exposed by the second bump pads 270.

Specifically, the two recess structures 270R of each of the second bump pads 270 may face each other toward the center of the second bump pad 270. Thus, a first virtual line 270L1 that extends along two recess structures 270R of one second bump pad 270 may be perpendicular to a second virtual line 270L2 that extends along two recess structures 270R of another second bump pad 270 located adjacent thereto. In some embodiments, each of the two recess structures 270R may include three sidewalls 270S that abut at right angles. In a view from above, the first bump pads 130 may have a circular shape, and the second bump pads 270 may have an H shape.

The number of recess structures of the second bump pad 270 is not limited thereto. For example, each of the second bump pads 270 may have at least three recess structures and thus, a shape of the second bump pads 270 may be changed.

As described above, the bump structures BS1 may be in contact with the first bump pads 130 and the second bump pads 270, respectively, and each have two portions that protrude through the two recess structures 270R. Each of the bump structures BS1 may fill the two recess structures 270R of the second bump pad 270. Accordingly, the portions of the top surface of each of the second through electrodes 250, which are exposed by the second bump pads 270, may be in direct contact with and electrically connected to the bump structures BS1.

Figure 3A:
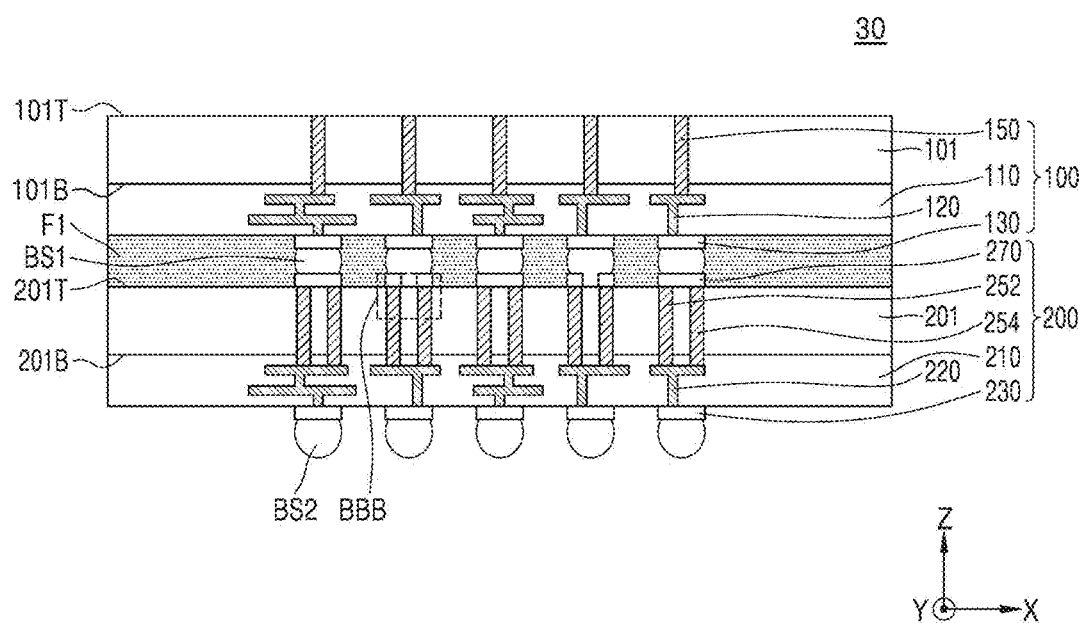
FIGS. 3A and 3B are diagrams of a semiconductor package according to an embodiment.
Figure 3B:
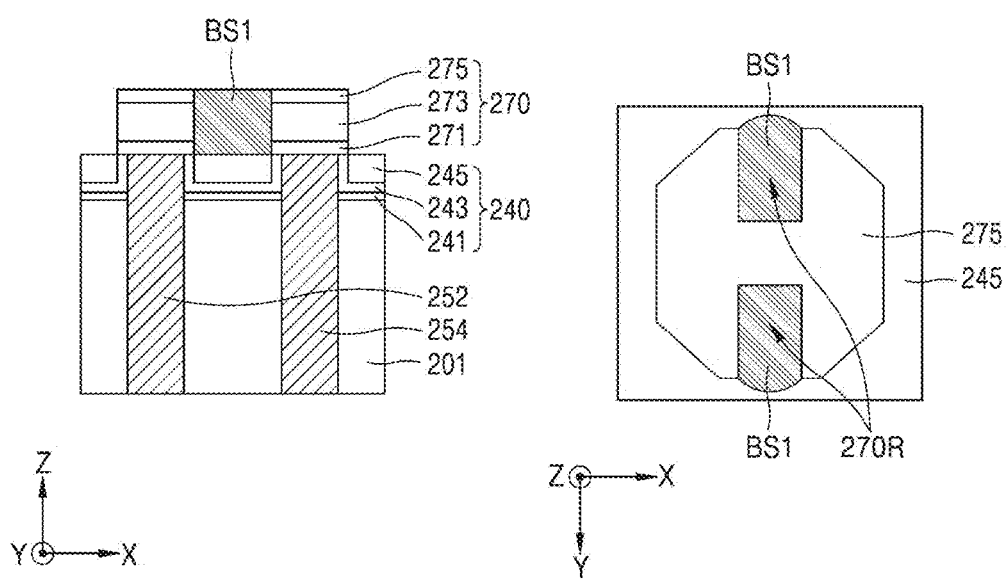

FIGS. 3A and 3B are diagrams of a semiconductor package 30 according to an embodiment.

Most components of the semiconductor package 30 to be described below and materials of the components may be substantially the same as or similar to those described above with reference to FIGS. 1A to 1C. Accordingly, differences between the semiconductor package 30 and the above-described semiconductor package (refer to 10 in FIG. 1A) will mainly be described for brevity.

Specifically, FIG. 3A is a cross-sectional view of the semiconductor package 30, and FIG. 3B shows an enlarged cross-sectional view (left) and an enlarged plan view (right) of portion BBB of FIG. 3A.

Referring to FIGS. 3A and 3B, the semiconductor package 30 may include a first substrate 101 having first bump pads 130, a second substrate 201 having second bump pads 270, and bump structures BS1 in contact with the first bump pads 130 and the second bump pads 270.

Each of the second bump pads 270 may have at least one recess structure 270R, which is recessed from a side surface of the second bump pad 270 toward a center thereof. In some embodiments, recess structures 270R of neighboring second bump pads 270 may be located and/or oriented in different directions.

One second bump pad 270 may be connected to two second through electrodes 252 and 254. The two second through electrodes 252 and 254 may pass through the second substrate 201 and extend from a second surface 201T of the second substrate 201 toward a bottom surface 201B thereof. Each of the two second through electrodes 252 and 254 may be connected to a second interconnection layer 220 included in a second semiconductor device layer 210. Second lower pads 230 may be formed on the second semiconductor device layer 210 and electrically connected to the two second through electrodes 252 and 254 through the second interconnection layer 220. Although the two second through electrodes 252 and 254 are exemplarily illustrated, the number of second through electrodes is not limited thereto. For example, at least three second through electrodes may be stacked.

In addition, due to the orientation of the recess structures 270R, portions of top surfaces of the two second through electrodes 252 and 254 may not be exposed by the second bump pads 270. In other words, all of the top surfaces of the two second through electrodes 252 and 254 may be covered by the second bump pads 270, and the bump structures BS1 may not be in direct contact with the two second through electrodes 252 and 254.

The semiconductor package 30 may be a high-bandwidth memory (HBM). The HBM may include a plurality of channels having interfaces, which are independent of each other, and have an increased bandwidth. Thus, the HBM may include a relatively increased through electrode. For example, each of core dies included in the HBM may include two channels, which correspond to the two second through electrodes 252 and 254, respectively. However, inventive concepts are not limited thereto.

Figure 4:
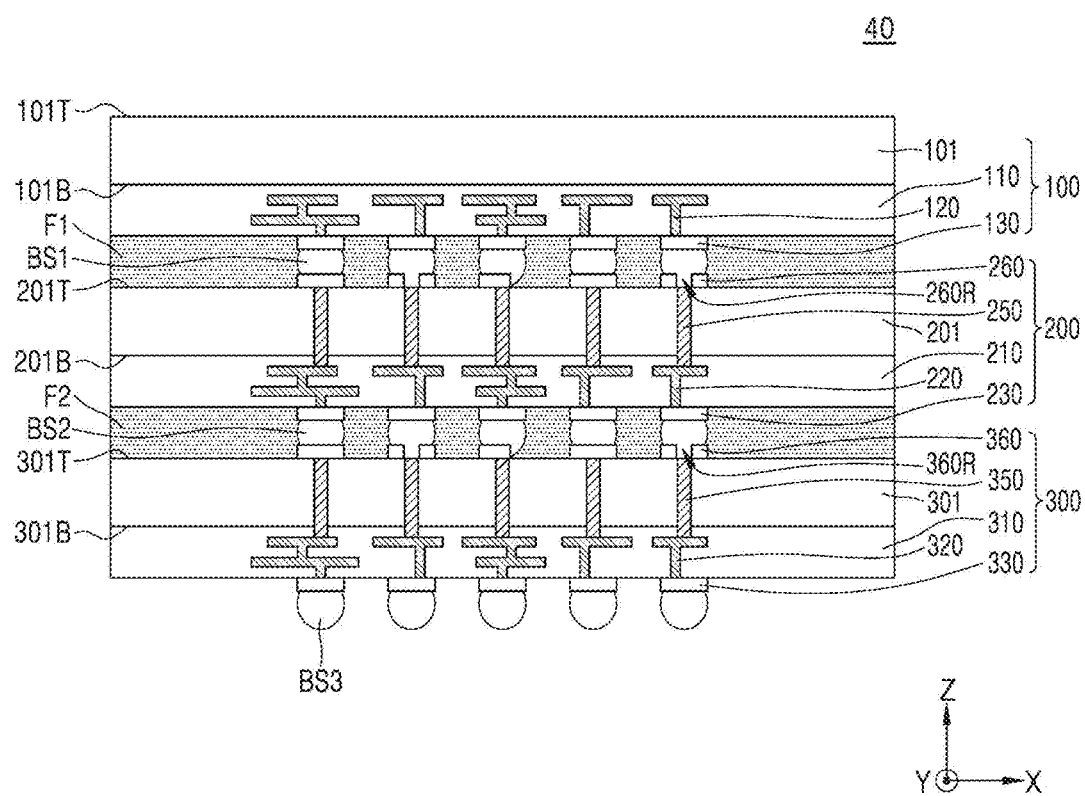
FIG. 4 is a cross-sectional view of a semiconductor package according to an embodiment.

FIG. 4 is a cross-sectional view of a semiconductor package 40 according to an embodiment.

Most components of the semiconductor package 40 to be described below and materials of the components may be substantially the same as or similar to those described above with reference to FIGS. 1A to 1C. Accordingly, for brevity, differences between the semiconductor package 40 and the above-described semiconductor package (refer to 10 in FIG. 1A) will mainly be described.

Referring to FIG. 4, the semiconductor package 40 may include a first substrate 101 having first bump pads 130, a second substrate 201 having second bump pads 260, and a third substrate 301 having third bump pads 360.

Each of first to third semiconductor devices 100, 200, and 300 included in the semiconductor package 40 may include a logic chip or a memory chip. For example, the first to third semiconductor devices 100, 200, and 300 may include memory chips of the same type. Alternatively, some of the first to third semiconductor devices 100, 200, and 300 may include memory chips, and some others thereof may include logic chips.

Although FIG. 4 only illustrates the first to third semiconductor devices 100, 200, and 300 stacked in the semiconductor package 40, the number of semiconductor devices stacked in the semiconductor package 40 is not limited thereto. For example, at least four semiconductor devices may be stacked in the semiconductor package 40.

The first semiconductor device 100 may include the first substrate 101, a first semiconductor device layer 110, a first interconnection layer 120, and the first bump pads 130. Unlike the second and third semiconductor devices 200 and 300, the first semiconductor device 100 may not include a through electrode. Unlike the second and third semiconductor devices 200 and 300, the first semiconductor device 100 may not include a through electrode.

The third semiconductor device 300 may include the third substrate 301, a third semiconductor device layer 310, a third interconnection layer 320, third lower pads 330, a third through electrode 350, and the third bump pads 360. The third semiconductor device 300 may have characteristics that are substantially the same as those of the second semiconductor device 200.

The third semiconductor device 300 may be located such that a top surface 301T of the third semiconductor device 300 faces a bottom surface 201B of the second semiconductor device 200. The third semiconductor device 300 may be electrically connected to the second semiconductor device 200 through second bump structures BS2 between the second semiconductor device 200 and the third semiconductor device 300.

In addition, a second adhesive film F2 may be between the bottom surface 201B of the second semiconductor device 200 and the top surface 301T of the third semiconductor device 300 and adhere the third semiconductor device 300 to the second semiconductor device 200. As shown in FIG. 4, the second adhesive film F2 may be in direct contact with the second semiconductor device 200 and the third semiconductor device 300 and surround the second bump structures BS2. The second adhesive film F2 may be substantially the same as the adhesive film F1.

Third bump structures BS3 may be in contact with the third lower pads 330, respectively. The third bump structures BS3 may electrically connect the semiconductor package 40 to an external base substrate (not shown). Via the third bump structures BS3, the third semiconductor device 300 may receive at least one of a control signal for an operation of the third semiconductor device 300, a power signal, a ground signal from outside the semiconductor package, receive a data signal to be stored in the third semiconductor device 300, or provide data stored in the third semiconductor device 300 to outside the semiconductor package. Each of the third bump structures BS3 may have a pillar structure, a ball structure, or a solder layer.

Each of the third bump pads 360 may have a recess structure 360R, which is recessed from a side surface of the third bump pad 360 toward a center thereof. In some embodiments, recess structures 360R of neighboring third bump pads 360 may be located and/or oriented in different directions. Also, due to the recess structure 360R, a portion of a top surface of the third through electrode 350 may be exposed by the third bump pads 360.

As described above, the second bump structures BS2 may be in contact with the second lower pads 230 and the third bump pads 360, respectively, and each have a portion that protrudes through the recess structure 360R. The second bump structures BS2 may fill the recess structures 360R of the third bump pads 360, respectively. Accordingly, a portion of a top surface of the third through electrode 350, which is exposed by the third bump pads 360, may be in direct contact with and electrically connected to the second bump structures BS2. Additionally, the second bump structures BS2 may be connected to two second through electrodes (252 and 254 of FIGS. 3A and 3B).

Figure 5:
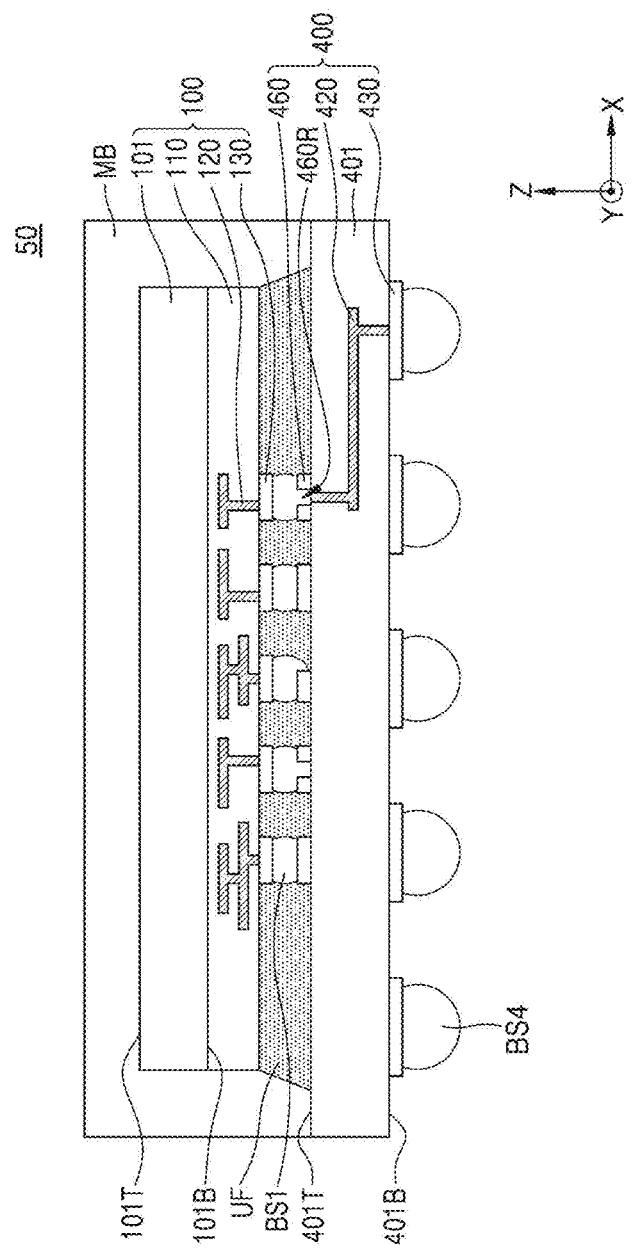
FIG. 5 is a cross-sectional view of a semiconductor package according to an embodiment.

FIG. 5 is a cross-sectional view of a semiconductor package 50 according to an embodiment.

Most components of the semiconductor package 50 to be described below and materials of the components may be substantially the same as or similar to those described above with reference to FIGS. 1A to 1C. Accordingly, differences between the semiconductor package 50 and the above-described semiconductor package (refer to 10 in FIG. 1A) will mainly be described for brevity.

Referring to FIG. 5, the semiconductor package 50 may include a first substrate 101 having first bump pads 130, a package substrate 400 having second bump pads 460, and bump structures BS1, which are in contact with the first bump pads 130 and the second bump pads 460, respectively.

The package substrate 400, which is a support substrate, may include a body unit 401, an upper protective layer, and a lower protective layer. The package substrate 400 may be formed based on a printed circuit board (PCB), a wafer substrate, a ceramic substrate, or a glass substrate. In the semiconductor package 50 according to the embodiment, the package substrate 400 may include a PCB.

In addition, an interconnection 420 may be formed on the package substrate 400. The interconnection 420 may be electrically connected to a first semiconductor device 100 through the bump structures BS1 connected to the second bump pads 460 formed on a top surface 401T of the package substrate 400.

Each of the second bump pads 460 may have a recess structure 460R, which is recessed from a side surface of the second bump pad 460 toward a center thereof. In some embodiments, recess structures 460R of neighboring second bump pads 460 may be located and/or oriented in different directions.

External connection terminals BS4 may be located on lower electrode pads 430 located on a bottom surface 401B of the package substrate 400. The semiconductor package 50 may be electrically connected to and mounted on a module substrate or a system board of an electronic product through the external connection terminals BS4.

Specifically, an interconnection 420 having a single layer or a multi-layered structure may be formed in the body unit 401, and the external connection terminals BS4 may be electrically connected to the first semiconductor device 100 through the interconnection 420. The upper protective layer and the lower protective layer may protect the body unit 401 and include, for example, solder resist.

When the package substrate 400 includes a PCB, the formation of the body unit 401 may typically include forming a thin film by compressing a polymer material (e.g., a thermosetting resin), an epoxy-based resin (e.g., flame retardant 4 (FR-4), bismaleimide triazine (BT), and ajinomoto build-up Film® (ABF), or a phenol resin to a consistent thickness, coating both sides of the thin film with copper foil, and performing a patterning to form the interconnection 420. The interconnection 420 may be a transmission path for an electric signal. The entire top surface and the entire bottom surface of the body unit 401, except for the lower electrode pads 430 and the second bump pads 460, may be coated with solder resist to form the upper protective layer and the lower protective layer.

PCBs may a single-sided PCB in which the interconnection 420 is formed on only one surface and a double-sided PCB in which the interconnection 420 is formed on both surfaces. In addition, at least three layers of copper foil may be formed using an insulator like prepreg, and at least three interconnections 420 may be formed according to the number of formed layers of copper foil. Thus, a PCB having a multi-layered structure may be implemented. However, the package substrate 400 is not limited to the above-described structure or material of the PCB.

A molding member MB may protect the first semiconductor device 100 from external influences, such as contamination and impact. To perform the above-described function, the molding member MB may be formed to such a thickness as to completely cover at least the first semiconductor device 100. Because the molding member MB completely covers the package substrate 400, a width of the molding member MB may be substantially equal to a width of the semiconductor package 50.

Furthermore, the molding member MB may include, for example, an epoxy molding compound (EMC). However, the molding member MB is not limited to an EMC and may include various materials, for example, an epoxy-based material, a thermosetting material, a thermoplastic material, or an ultraviolet (UV)-processing material.

An underfill UF may be formed between the first semiconductor device 100 and the package substrate 400. A gap may be formed between the first semiconductor device 100 and the package substrate 400. Because the gap may cause a problem in reliability of connection between the first semiconductor device 100 and the package substrate 400, the underfill UF may be injected to reinforce the connection between the first semiconductor device 100 and the package substrate 400. In some cases, the underfill UF may be omitted, and a molded underfill (MUF) process may be employed instead of the underfill UF.

FIG. 6 is a flowchart of a method of manufacturing a semiconductor package, according to an embodiment.

Referring to FIG. 6, a method S10 of manufacturing the semiconductor package may include a first operation (S110) of locating a second substrate, which is synonymous with a lower substrate, a second operation (S120) of forming a mask pattern on the second substrate, a third operation (S130) of forming second bump pads on the second substrate, a fourth operation (S140) of removing the mask pattern from the second substrate, a fifth operation (S150) of adhering an adhesive film onto the second substrate, and a sixth operation (S160) of connecting a first substrate (e.g., an upper substrate) to the second substrate using bump structures.

The method S10 of manufacturing the semiconductor package may include the above-described operations S110 to S160. When some embodiments may be embodied otherwise, respective process operations described herein may be performed otherwise. For example, two process operations described in a sequential order may be performed substantially at the same time or in reverse order.

Technical characteristics of each of the first to sixth operations S110 to S160 will be described in detail below with reference to FIGS. 7A to 7F.

FIGS. 7A to 7F are diagrams showing a process sequence of a method of manufacturing a semiconductor package, according to an embodiment.

Figure 7A:
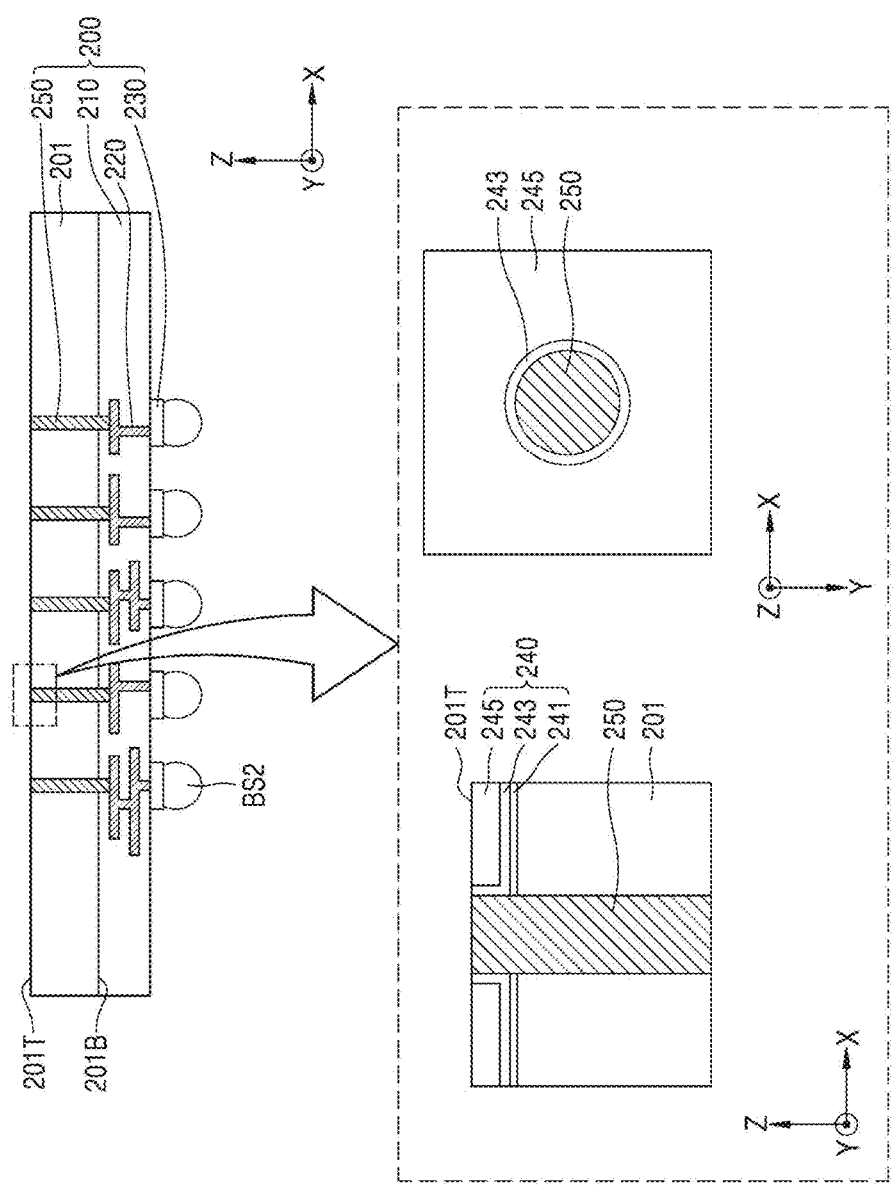
FIGS. 7A to 7F are diagrams showing a process sequence of a method of manufacturing a semiconductor package, according to an embodiment.

Referring to FIG. 7A, a second semiconductor device 200 may be prepared. The semiconductor device 200 may include a second through electrode 250 capable of extending an integrated circuit (IC) function of a second semiconductor device layer 210 formed on a second substrate 201 to the outside.

The second semiconductor device 200 may include a plurality of second through electrodes 250. In general, methods of forming the second through electrode 250 may be a via-first method, a via-middle method, and a via-last method. The via-first method may refer to a method of forming the second through electrode 250 before an IC of a semiconductor device is formed. The via-middle method may refer to a method of forming the second through electrode 250 after the IC of the semiconductor device is formed and before an interconnection layer is formed. The via-last method may refer to a method of forming the second through electrode 250 after the interconnection layer is formed.

For example, in the via-last method, the second semiconductor device layer 210 and a second interconnection layer 220 may be formed on a bottom surface 201B of the second substrate 201, and the second through electrode 250 may be formed to pass through the second substrate 201 from a top surface 201T of the second substrate 201 to the bottom surface 201B thereof.

Figure 7B:
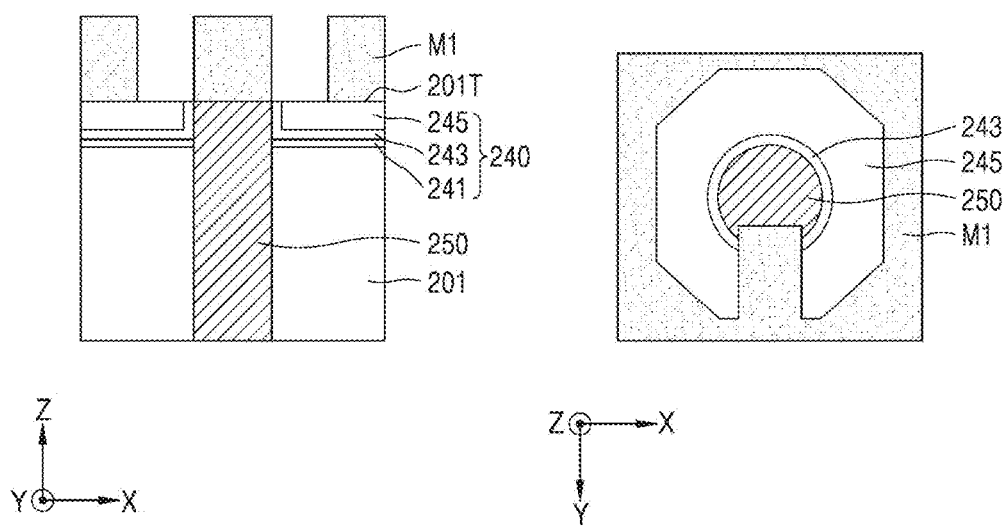

Referring to FIG. 7B, a mask pattern M1 may be formed on the second surface 201T of the second substrate 201.

The mask pattern M1 may be formed using a photolithography process and a development process on the second surface 201T of the second substrate 201. The mask pattern M1 may be formed as a pattern exposing a portion of the second through electrode 250 and a portion of an upper passivation layer 240.

Areas of the second surface 201T, which are exposed by the mask pattern M1, may correspond to areas that are in direct contact with second bump pads (260 in FIG. 7C) in a subsequent process.

Figure 7C:
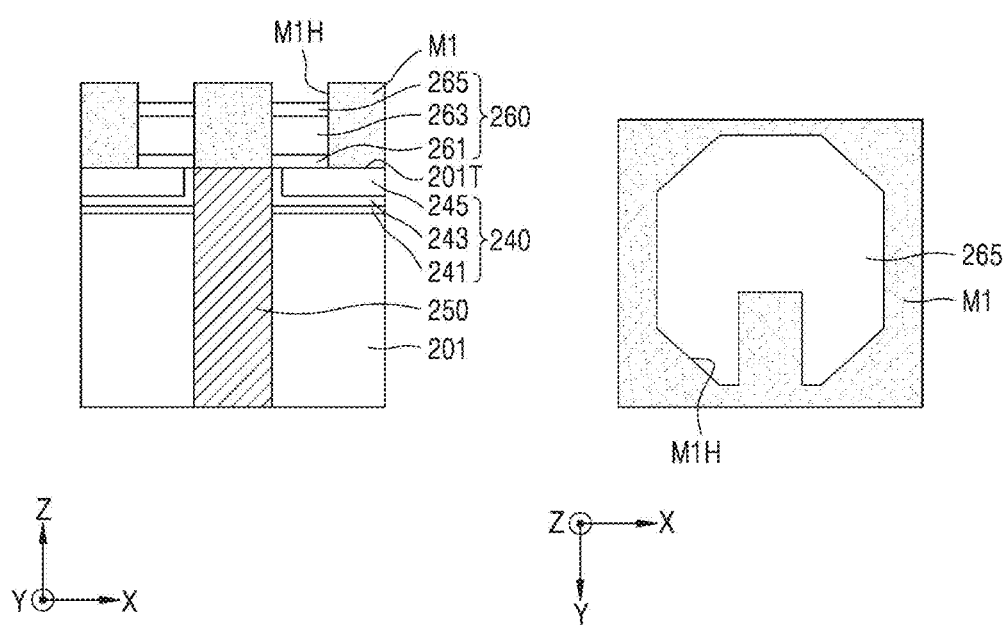

Referring to FIG. 7C, the second bump pads 260 may be formed on the top surface of the second substrate 201 to fill holes M1H of the mask pattern M1.

The second bump pads 260 may include a first conductive layer 261, a second conductive layer 263, and a third conductive layer 265. The second bump pads 260 may be formed using a deposition process like chemical vapor deposition (CVD) or physical vapor deposition (PVD) but the inventive concepts are not limited thereto.

The second bump pads 260 may include, but not limited thereto, at least one of aluminum (Al), copper (Cu), nickel (Ni), tungsten (W), platinum (Pt), and gold (Au).

The second bump pads 260 may be in direct contact with and electrically connected to the second through electrode 250.

Figure 7D:
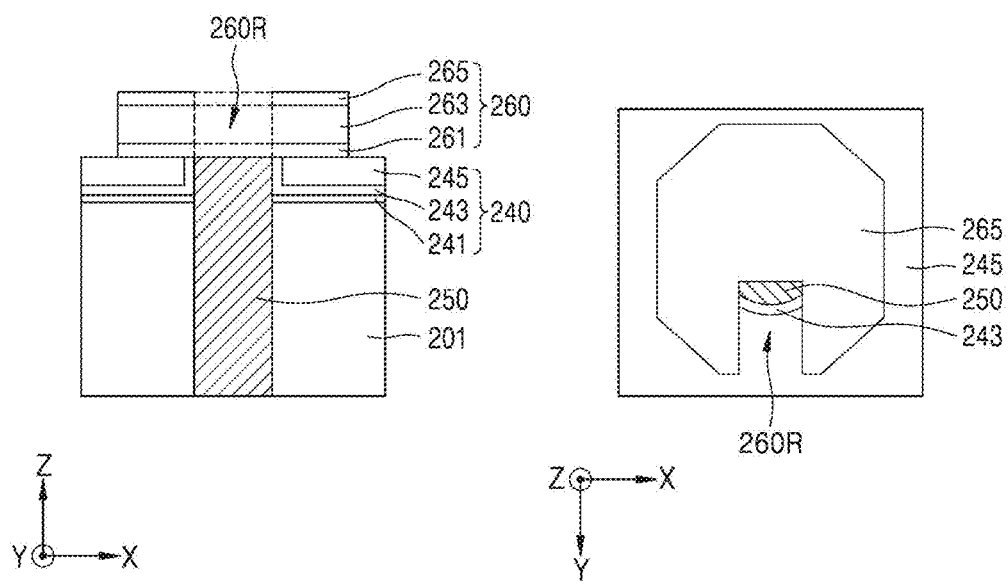

Referring to FIG. 7D, the mask pattern (refer to M1 in FIG. 7C) may be removed to form second bump pads 260 having recess structures 260R.

A stripping process and/or an ashing process may be performed to remove the mask pattern (refer to M1 in FIG. 7C).

Each of the second bump pads 260 may have the recess structure 260R, which is recessed from a side surface of the second bump pad 260 toward a center thereof. In some embodiments, recess structures 260R of neighboring second bump pads 260 may be located and/or oriented in different directions. Also, due to the recess structure 260R, a portion of a top surface of the second through electrode 250 may be exposed by the second bump pad 260.

Figure 7E:
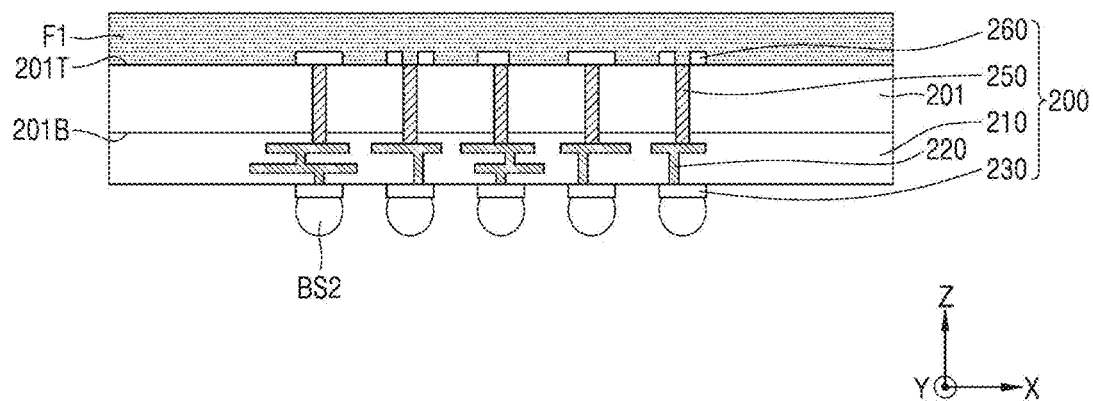

Referring to FIG. 7E, an adhesive film F1 may be formed to completely cover the top surface 201T of the second substrate 201 and the second bump pads 260.

As shown in FIG. 7E, the adhesive film F1 may be in direct contact with the second semiconductor device 200 and surround the second bump pads 260. The adhesive film F1 may include a DAF.

Figure 7F:
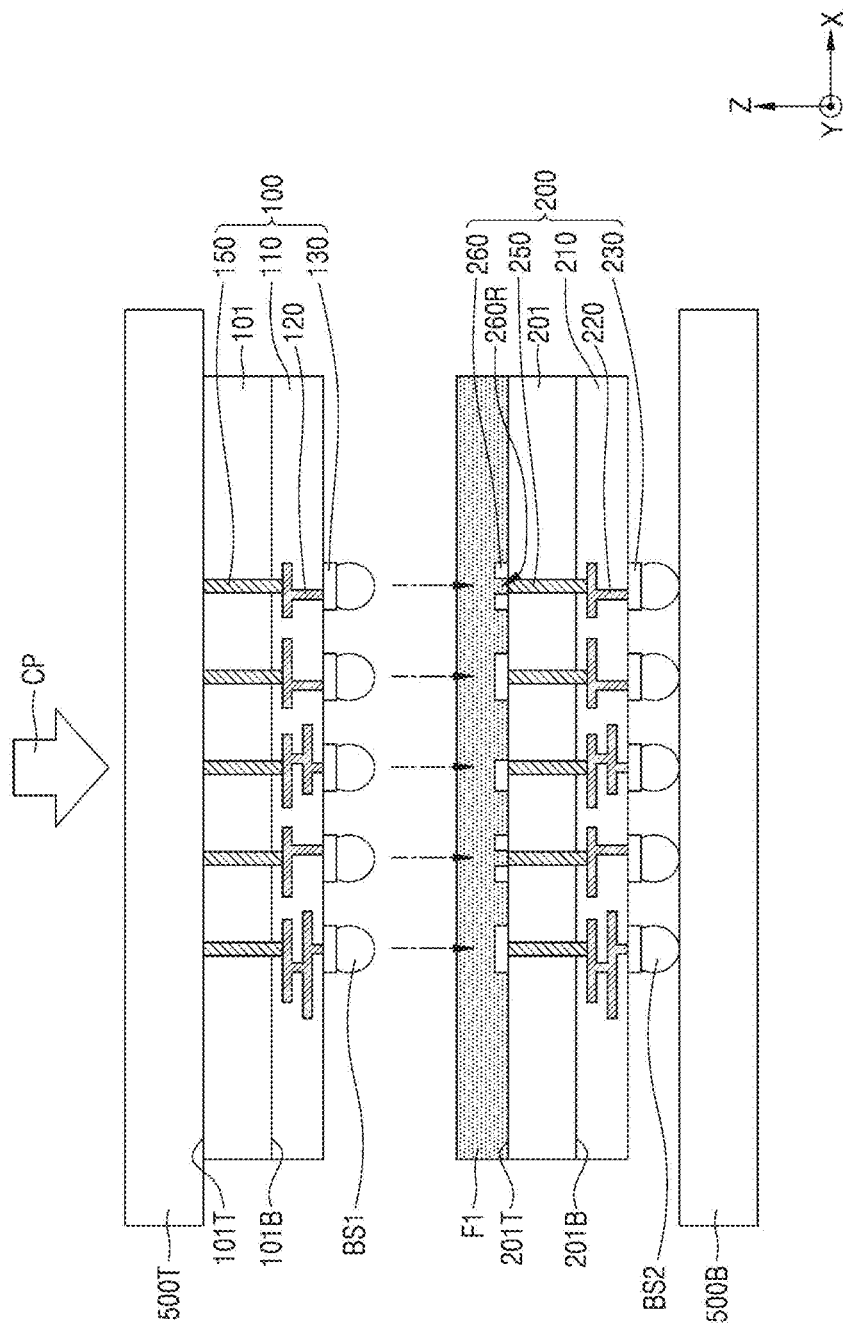

Referring to FIG. 7F, a first surface 101B of a first semiconductor device 100 may be disposed opposite to the top surface 201T of the second semiconductor device 200 between an upper press plate 500T and a lower support plate 500B.

Due to pressure CP applied to the upper press plate 500T, the second semiconductor device 200 may displace the adhesive film F1, and may be electrically connected to the first semiconductor device 100 through bump structures BS1 interposed between the first semiconductor device 100 and the second semiconductor device 200.

The upper press plate 500T may be connected to a robot arm (not shown), and the lower support plate 500B may be of a stage type. Accordingly, pressures applied to the first semiconductor device 100 and the second semiconductor device 200 may vary according to the arrangement and shapes of the upper press plate 500T and the lower support plate 500B.

Referring back to FIG. 1A, in the semiconductor package 10 according to the present embodiment, the second bump pads 260 having the recess structures 260R may be disposed under the bump structures BS1. Thus, even under compression conditions, such as excessive pressing and/or misalignment between the first and second substrates 101 and 201, a direction in which the bump structure BS1 protrudes may be guided by the recess structure 260R in a desired (and/or alternatively predetermined) direction. Therefore, the electrical characteristics and reliability of the semiconductor package 10 may be improved.

Figure 8:
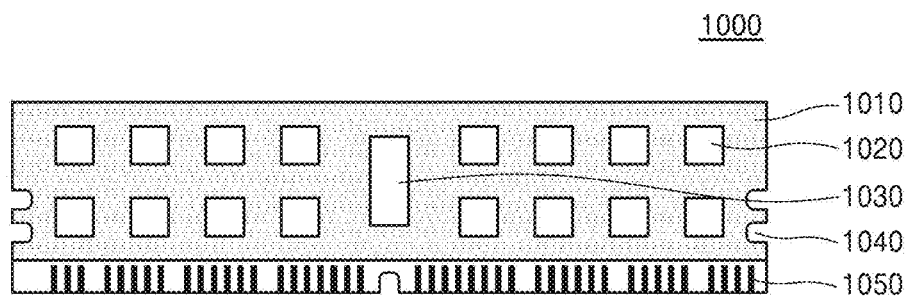
FIG. 8 is a plan view of a semiconductor module including a semiconductor package according to an embodiment.

FIG. 8 is a plan view of a semiconductor module 1000 including a semiconductor package 1020 according to an embodiment.

Referring to FIG. 8, the semiconductor module 1000 may include a module substrate 1010, a plurality of semiconductor packages 1020 and a controller chip 1030, which are mounted on the module substrate 1010, and an indentation structure 1040 and a port 1050, which are located on edges of the module substrate 1010.

The module substrate 1010 may be a support substrate on which the plurality of semiconductor packages 1020 and the controller chip 1030 are mounted. The module substrate 1010 may be a printed circuit board (PCB) having a desired (and/or alternatively predetermined) form factor. The form factor may define a thickness and upper, lower, left, and right widths of the module substrate 1010.

The plurality of semiconductor packages 1020 may include any one of the semiconductor packages 10 to 50 according to the embodiments described with reference to FIGS. 1A to 5. The plurality of semiconductor packages 1020 may be electrically connected to the ports 1050 through interconnections (not shown) included in the module substrate 1010.

The controller chip 1030 may control the plurality of semiconductor packages 1020. For example, the controller chip 1030 may read data stored in the plurality of semiconductor packages 1020 or program new data to the plurality of semiconductor packages 1020 in response to a command from an external host.

At least one indentation structure 1040 may be included in the semiconductor module 1000 so that the module substrate 1010 may be mounted on and fixed to a main board or a system board.

The port 1050 may include a plurality of pins, and the number, size, and arrangement of the pins may be determined based on an interface protocol configured to communicate with an external host. The plurality of pins may be connected to sockets included in the main board or the system board.

Figure 9:
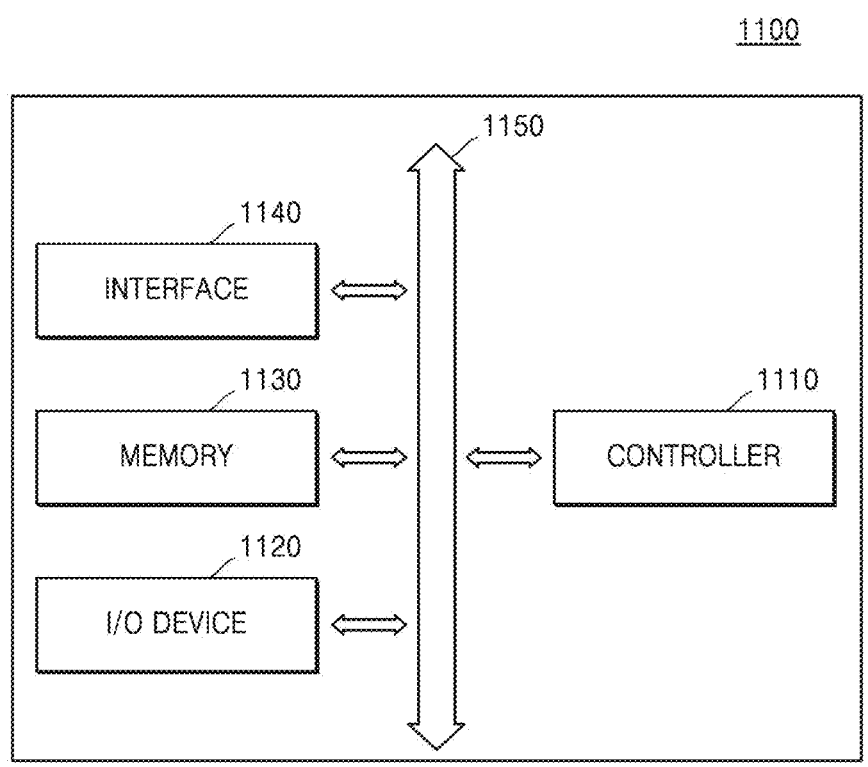
FIG. 9 is a construction diagram of a system of a semiconductor package according to an embodiment.

FIG. 9 is a construction diagram of a system 1100 of a semiconductor package according to an embodiment.

Referring to FIG. 9, the system 1100 may include a controller 1110, an input/output (I/O) device 1120, a memory 1130, an interface 1140, and a bus 1150.

The system 1100 may include a mobile system or a system configured to transmit or receive information. In some embodiments, the mobile system may be a portable computer, a web tablet, a mobile phone, a digital music player, or a memory card.

The controller 1110 may be configured to control an execution program in the system 1100 and include an MP, a DSP, a microcontroller (MC), or a device similar thereto.

The I/O device 1120 may be used to input or output data to and from the system 1100. The system 1100 may be connected to an external device (e.g., a personal computer (PC) or a network) using the I/O device 1120 and exchange data with the external device. The I/O device 1120 may include, for example, a touch pad, a keyboard, or a display device.

The memory 1130 may store data for an operation of the controller 1110 or store data processed by the controller 1110. The memory 1130 may include any one of the semiconductor packages 10 to 50 according to the embodiments described with reference to FIGS. 1A to 5.

The interface 1140 may be a data transmission path between the system 1100 and an external device. The controller 1110, the I/O device 1120, the memory 1130, and the interface 1140 may communicate with each other through the bus 1150.

While inventive concepts have been particularly shown and described with reference to embodiments thereof, it will be understood that various changes in form and details may be made therein without departing from the spirit and scope of the following claims.

What is claimed is:

1. A semiconductor package comprising:
   a first substrate having a first surface and including a first electrode;
   a first bump pad on the first surface of the first substrate, the first bump pad being connected to the first electrode;
   a second substrate having a second surface facing the first surface of the first substrate, the second substrate including a second electrode;
   a row of second bump pads on the second surface of the second substrate, the row of second bump pads including a second bump pad and neighboring second bump pads, the second bump pad having a recess structure that is recessed from a side surface of the second bump pad toward a center thereof, the second bump pad being connected to the second electrode, the neighboring second bump pads neighboring the second bump pad and including recess structures, the recess structures of the neighboring second bump pads being oriented in different directions; and
   a bump structure contacting the first bump pad and the second bump pad, the bump structure having a portion protruding through the recess structure of the second bump pad.

2. The semiconductor package of claim 1, wherein the bump structure fills the recess structure of the second bump pad.

3. The semiconductor package of claim 2, wherein a portion of the second electrode is exposed by the recess structure of the second bump pad to provide an exposed portion of the second electrode,
   wherein the exposed portion of the second electrode is in contact with the bump structure.

4. The semiconductor package of claim 1, wherein the recess structures of the neighboring second bump pads are oriented at a rotational angles of 90°, 180°, or 270° with each other.

5. The semiconductor package of claim 1, wherein the recess structure of the second bump pad includes three sidewalls that abut each other at right angles.

6. The semiconductor package of claim 1, wherein,
   the first bump pad has a circular shape in a plan view; and
   and the second bump pad has a polygonal shape in the plan view.

7. The semiconductor package of claim 1, further comprising:
   an adhesive film surrounding the first bump pad, the second bump pad, and the bump structure.

8. The semiconductor package of claim 1, wherein each of the first electrode and the second electrode include a through-silicon via (TSV).

9. The semiconductor package of claim 1, wherein
   the first substrate includes a semiconductor substrate; and
   the second substrate includes a printed circuit board (PCB).

10. The semiconductor package of claim 1, further comprising:
    a third substrate having a third surface facing an opposite surface of the second surface of the second substrate, the third substrate including a third electrode;
    a third bump pad and neighboring third bump pads on the third surface of the third substrate the third bump pad having a recess structure oriented in one direction, the third bump pad being connected to the third electrode, the neighboring third bump pads neighboring the third bump pad and including recess structures, the recess structures of the neighboring third bump pads being oriented in different directions; and
    an other bump structure in contact with the third bump pad, the other bump structure having a portion that protrudes through the recess structure of the third bump pad.

11. A semiconductor package comprising:
    a first substrate having a first surface;
    a first bump pad on the first surface of the first substrate;
    a second substrate having a second surface located opposite the first surface of the first substrate;
    a second bump pad and a neighboring second bump pad on the second surface of the second substrate, the second bump pad having two recess structures that are each recessed from a side surface of the second bump pad toward a center thereof, the neighboring second bump pad neighboring the second bump pad and including two recess structures, and a first virtual line extending along the two recess structures of the second bump pad being perpendicular to a second virtual line extending along the two recess structures of the neighboring second bump pad; and
    a bump structure contacting the first bump pad and the second bump pad.

12. The semiconductor package of claim 11, wherein portions of the second surface of the second substrate are exposed by the two recess structures of the second bump pad to provide exposed portions of the second surface of the second substrate,
    the bump structure fills the two recess structures of the second bump pad, and
    the exposed portions of the second surface are in contact with the bump structure.

13. The semiconductor package of claim 12, wherein the bump structure protrudes through the two recess structures of the second bump pad.

14. The semiconductor package of claim 11, wherein the two recess structures of the second bump pad face each other toward the center of the second bump pad.

15. The semiconductor package of claim 14, wherein,
    the first bump pad has a circular shape in a plan view, and
    the second bump pad has an H shape in the plan view.

16. A semiconductor package comprising:
    a first substrate having a first surface and including a first through electrode;
    a first bump pad on the first surface of the first substrate, the first bump pad being connected to the first through electrode;
    a second substrate having a second surface located opposite to the first surface of the first substrate, the second substrate including a second through electrode and other second through electrodes;
    a second bump pad and neighboring second bump pads on the second surface of the second substrate, the second bump pad having a recess structure that is recessed from a side surface of the second bump pad toward a center thereof, the second bump pad being connected to the second through electrode, the neighboring second bump pads neighboring the second bump pad and including recess structures, the recess structures of the neighboring second bump pads being oriented in different directions, a corresponding one of the neighboring second bump pads being connected to at least two of the other second through electrodes; and a bump structure contacting the first bump pad and the second bump pad.

17. The semiconductor package of claim 16, wherein the second bump pad has at least one recess structure.

18. The semiconductor package of claim 17, wherein the at least one recess structure of the second bump pad includes two recess structures; and a first virtual line extending along the two recess structures of the second bump pad is perpendicular to a second virtual line extending along two recess structures of the corresponding one of the neighboring second bump pads.

19. The semiconductor package of claim 16, wherein the second through electrode is not exposed by the recess structure of the second bump pad and the bump structure is not in direct contact with the second through electrode.

20. The semiconductor package of claim 16, wherein the first substrate and the second substrate include semiconductor devices; and the semiconductor devices include high-bandwidth memories.

* * * * *